United States Patent [19]

Blaugher et al.

[11] Patent Number: 4,904,341

[45] Date of Patent: Feb. 27, 1990

[54] SELECTIVE SILICON DIOXIDE ETCHANT FOR SUPERCONDUCTOR INTEGRATED CIRCUITS

[75] Inventors: Richard D. Blaugher, Pittsburgh; Joseph Buttyan, Wilkins Township, Alleghney County; John X. Przybysz, Penn Hills, all of Pa.

[73] Assignee: Westinghouse Electric Corp., Pittsburgh, Pa.

[21] Appl. No.: 234,992

[22] Filed: Aug. 22, 1988

[51] Int. Cl.$^4$ .................. B44C 1/22; C03C 15/00; C03C 25/06

[52] U.S. Cl. .................. 156/643; 156/644; 156/646; 156/653; 156/657; 156/659.1; 204/192.24; 204/192.37; 252/79.1; 505/816

[58] Field of Search ............... 156/643, 644, 646, 653, 156/657, 659.1, 662, 667; 252/79.1; 204/192.24, 192.32, 192.35, 192.37; 427/38, 39, 62, 63; 357/65, 71, 67; 505/816, 820, 51; 437/238

[56] References Cited

U.S. PATENT DOCUMENTS

| | | | |
|---|---|---|---|
| 4,421,785 | 12/1983 | Kroger | 427/63 |
| 4,423,430 | 12/1983 | Hasuo et al. | 357/5 |
| 4,430,662 | 2/1984 | Jillie | 357/5 |
| 4,498,228 | 2/1985 | Jillie | 29/577 |
| 4,522,681 | 6/1985 | Gorowitz et al. | 252/79.1 X |
| 4,554,567 | 11/1985 | Jillie | 357/5 |
| 4,609,903 | 9/1986 | Toyokura | 338/22 SD |
| 4,711,698 | 12/1987 | Douglas | 156/646 X |
| 4,807,016 | 2/1989 | Douglas | 357/67 |

OTHER PUBLICATIONS

Paper by S. Kosaka et al, Entitled "An Integration of all Refractor Josephson Logic LSI Circuit", IEEE Transactions on Magnetics, vol. MAG-21, No. 2, Mar. 1985, pp. 102–109.

M. Radparvar et al., "Fabrication and Performance of all NbN Josephson Junction Circuits", IEEE Trans. Mag., vol. MAG-23, No. 2, pp. 1480–1483, Mar. 1987.

L. S. Yu et al., "An All-Niobium Eight Level Process for Small and Medium Scale Applications", IEEE Trans. on Magnetics, vol. MAG-23, No. 2, pp. 1476–1479, Mar. 1987.

S. Kotani et al., "High-Speed Unit-Cell for Josephson LSI Circuits Using Nb/AlOx,Nb Junctions," IEEE Trans. on Magnetics, vol. MAG-23, No. 2, pp. 869–874, Mar. 1987.

*Primary Examiner*—William A. Powell
*Attorney, Agent, or Firm*—R. A. Stoltz

[57] ABSTRACT

This is an improved method for providing silicon dioxide with openings which expose contact pad areas for connections to superconductor in the preparation of superconducting integrated circuits. It relates to the type of method which utilizes depositing of a silicon dioxide film on a substrate (including over superconductor conductor patterns on the substrate surface), placing a resist film on the silicon dioxide film, patterning the resist film to expose portions of the silicon dioxide, and reactive ion etching the exposed portions of the silicon dioxide film to expose contact pad areas of superconductor. The improvement utilizes an etchant gas consisting essentially of 50–95 volume percent nitrogen trifluoride and 5–50 volume percent rare gas (preferably about 77 volume percent nitrogen trifluoride, with argon or neon or mixtures thereof as the rare gas) for the reactive ion etching of the exposed portions of the silicon dioxide film. Thus a carbon-containig etchant is not used and polymer by-products of the etching process are essentially completely avoided.

8 Claims, No Drawings

SELECTIVE SILICON DIOXIDE ETCHANT FOR SUPERCONDUCTOR INTEGRATED CIRCUITS

CROSS-REFERENCE TO RELATED APPLICATION

A method for preparing, and configuration of, molybdenum resistors in a superconductor integrated circuit are described in co-pending related application Ser. No. 234,436, filed Aug. 19, 1988 assigned to the same assignee. That related application uses an aluminum film over a substrate and superconductor conductors, but under the molybdenum film which is to be patterned into resistors. The aluminum film provides an aluminum-molybdenum etch stop interface (the portions of interface and aluminum film, which are not under the molybdenum resistor and are thus exposed by etching, are then rendered non-conductive by oxidization). The aluminum-molybdenum etch stop interface protects the superconductor conductors and any other underlayers and increases processing margins for the etch time.

A superconducting digital logic amplifier for interfacing between a low voltage Josephson junction logic circuit and a higher voltage semiconductor-circuit input is described in copending application Ser. No. 194,688, filed May 16, 1988, now U.S. Pat. No. 4859879.

That amplifier uses a first series string of at least three lower critical current Josephson junctions (e.g. about 0.5 milliamp) connected in series with an input Josephson junction to provide a series combination and a second series string of at least four high critical current (e.g. about 1.5 milliamp) Josephson junctions connected in parallel with the series combination, to provide parallel strings having an upper common connection connected to the output terminal. A pulsed DC current source is connected to the parallel strings at the upper common connection. During a pulse from the DC current source, signal on the amplifier input exceeds the critical current of the input Josephson junction, which in turn causes the critical current of the other Josephson junctions in the amplifier to be exceeded, causing a higher power pulse on the output terminal during the remainder of the pulse from the current source. By using an appropriate number of junctions in the series strings, a low power signal from a Josephson logic circuit is raised, by the logic amplifier, to a power appropriate to drive a conventional semiconductor circuit.

BACKGROUND OF THE INVENTION

1. Field of the Invention

This invention relates to superconductor integrated circuits, and in particular provides a non-carbon containing etchant for the etching of insulators in superconductor integrated circuits.

2. Description of Related Art

Superconductor integrated circuits are potentially valuable components of future radar systems, infrared imaging systems, and satellite communications systems. Superconductive electronics offers high speed, low noise, and low power dissipation.

Superconductor integrated circuits using Josephson tunnel junction devices have been described in a number of U.S. patents including 4,430,662 issued Feb. 7, 1984, and 4,554,567 issued Nov. 19, 1985, and 4,498,228, issued Feb. 12, 1985, all to Jillie and Smith, and all describing integrated circuitry and methods of manufacture. Josephson junction device configurations are also shown in U.S. Pat. Nos. 4,423,430 issued Dec. 27, 1983 to Hasuo et al. and 4,421,785 issued Dec. 20, 1983 to Kroger and U.S. Pat. No. 4,609,903 issued Sept. 2, 1986 to Toyokura et al. A paper by S. Kosaka et al. entitled "An Integration of All Refractor Josephson Logic LSI Circuit", (IEEE Transactions On Magnetics, Volume MAG-21, No. 2, March 1985, pp. 102-109) provides several examples of etch stop by chemical selectivity, (i.e. the layer being etched has a much higher etch rate than the layers underneath).

The fabrication of refractory superconducting integrated circuits is facilitated by the use of reactive ion etching. The material constituents used in these circuits includes Mo, Nb, NbN, and Ti and the dielectrics $SiO_2$ and $Al_2O_3$. These materials, especially the refractory metallics, present great difficulty in obtaining even nominal feature resolution of 1.0 micron using lift off and wet etching techniques. A reactive ion etching (RIE) based process allows superior pattern transfer and improved edge delineation compared to wet etching methods. RIE allows fairly uniform etching over the entire surface with well defined profile and step characteristics compared to other transfer methods. It is also possible by proper selection of the etching gas and conditions to obtain pronounced etch selectivity, i.e. a metallic constituent may be etched preferentially with respect to the dielectric or the dielectric may be preferentially removed leaving the metallic relatively unaffected. Photoresist masks are generally used in addition to RIE selectivity to define the circuit components.

The etchant gas and plasma conditions must be carefully determined to achieve an acceptable etch selectivity. Optimization to obtain maximum selectivity is determined by detailed experimental testing to establish proper mixtures and gas ratios, flow rates and plasma electrical parameters. The goal of the optimization process is to obtain the greatest ratio between the etch rate of the overlayer and the etch rate of the underlayer.

Selectivity can be demonstrated, for example, by comparing the etching of a Nb and $Al_2O_3$ (or Al) two layer composite with $CF_4$ vs. $CCl_4$ vs. $CCl_4$. $Al_2O_3$ or Al can be easily etched by using a chlorine containing gas such as $CCl_4$. The reacted product is then $AlCl_3$ which has a significant vapor pressure at a relatively low temperature ($\sim 1.0$ torr at 100° C.) and is thus easily dissociated by RIE at ambient temperatures. It is difficult to etch $Al_2O_3$ preferentially in a circuit configuration where Nb is also present and unprotected, unless the Nb is attacked at a markedly reduced rate. That result, in fact, is obtained for $CCl_4$, where $Al_2O_3$ (or Al) etches faster than Nb, providing modest selectivity for $Al_2O_3$ over Nb. By changing the etch gas to $CF_4$, the etch rate for Nb will remain almost the same as the etch gas to $CF_4$, the etch rate for Nb will remain almost the same as observed for $CCl_4$, with virtually no etching seen for the $Al_2O_3$. Etching $Al_2O_3$ with $CF_4$ forms $AlF_3$, which has a significant vapor pressure only at very high temperature ($\sim 1.0$ torr at 1238° C.) and thus almost impossible to dissociate or etch in an RIE process. It is thus possible with $CF_4$ to easily selectively etch Nb leaving $Al_2O_3$ completely unaffected.

Selectivity of etch rates is a desired condition, but other factors may also be important. Problems are encountered when one attempts to etch vias through a layer of $SiO_2$ insulator down to a metallic underlayer of Nb or NbN. The standard techniques to reactive ion etch the $SiO_2$ is to use $CHF_3$ as noted by M. Radparvar et al., ("Fabrication and Performance of All NbN Josephson Junction Circuits," IEEE Trans. Mag., Vol. *MAG*-23, No. 2, pp. 1480-1483, March 1987) and L. S. Yu et al. ("An All-Niobium Eight Level Process for Small and Medium Scale Applications," IEEE Trans. on Magnetics, Vol. *MAG*-23. No. 2, pp. 1476-1479, March 1987), or to use $CHF_3$ and $O_2$ as noted by S. Kotani et al. "High-Speed Unit-Cell for Josephson LSI Circuits Using Nb/AlOx/Nb Junctions," IEEE Trans. on Magnetics, Vol. Mag-23, No. 2, pp. 869-874, March, 1987).

SUMMARY OF THE INVENTION

This is an improved method for providing silicon dioxide with openings which expose contact pad areas for connections to superconductor in the preparation of superconducting integrated circuits. It relates to the type of method which utilizes depositing of a silicon dioxide film on a substrate which has superconductor on parts of its surface (thus covering the superconductor conductors and exposed substrate), placing a resist film on the silicon dioxide film, patterning the resist film to expose portions of the silicon dioxide, and reactive ion etching the exposed portions of the silicon dioxide film to expose contact pad areas of superconductor. The improvement utilizes an etchant gas consisting essentially of 50-95 volume percent nitrogen trifluoride and 5-50 volume percent rare gas for the reactive ion etching of the exposed portions of the silicon dioxide film. Thus a carbon-containing etchant is not used and polymer by-products of the etching process are essentially completely avoided.

Preferably the etchant gas is 67-87 volume percent nitrogen trifluoride (more preferably 72-82 volume percent nitrogen trifluoride, and most preferably about 77 volume percent nitrogen trifluoride) and a plasma power density of about 0.27 watt/square centimeter and an etch chamber at a pressure of about 75 millitorr is utilized during the reactive ion etching. Preferably the superconductor is niobium or niobium nitride and the rare gas is argon or neon or mixtures thereof.

DESCRIPTION OF THE PREFERRED EMBODIMENTS

Carbon containing etch gases are prone to leave polymer deposits on the circuit and on the walls of the reactor. Polymers are difficult to remove and cause particulate contamination in the integrated circuit processing. Our new method is to reactive ion etch $SiO_2$ through the use of $NF_3$ mixed with a rare gas (e.g. argon). The etch leaves no polymers. Furthermore, it etches $SiO_2$ selectively, with respect to Nb or NbN.

This new etchant gas mixture has been demonstrated by experimental test to resolve features in a superconducting circuit. The ability to use this etchant has greatly facilitated the fabrication of the circuit and has not degraded in any way the desired physical properties, i.e. superconducting transition temperature, critical current, dielectric strength, and mechanical integrity.

We have discovered that a mixture of nitrogen trifluoride ($NF_3$) with Ar (or other rare gases such as neon or neon-argon mixtures) will produce acceptable selectivity for use in a reactive ion etching process for defining $SiO_2$ over Nb or NbN thin films. Use of the $NF_3$ gas without Ar produced highly reactive, essentially uncontrollable, conditions. Adding Ar (at least 5%) stabilized the plasma and produced a uniform etch over the entire wafer surface (~5 cm diameter). The gas mixture that produced the best results was $NF_3+23\%$ Ar. The mixture was introduced to the etch chamber at a 75 millitorr pressure with flow rates of: $NF_3 - 14.4$ SCCM and Ar—4.3 SCCM.

The optimum plasma power was determined to be 135W for a 25.4 cm diameter etch plate or a power density of 0.27 $W/cm^2$ These etch conditions produced the results summarized in Table I.

TABLE I

| Material | Etch Rate |
|---|---|
| $SiO_2$ | 850 A/min |
| Nb | 200 A/min |
| NbN | 90 A/min | for a selectivity of

TABLE II

| Material | Etch Rate |
|---|---|
| $SiO_2$:Nb | 4.2:1 |
| $SiO_2$:NbN | 9:1 |

These results show that the combination of $NF_3$ and Ar (other rare gases, or mixtures thereof, should produce similar results) provides good etch selectivity for $SiO_2$ over Nb or NbN. This gas mixture has the added advantage of no polymer by-products; since carbon is not present, polymer precursors are not produced, which eliminates the polymer deposits that occur with other common gases such as $CF_4$, $CCl_4$ and $CCl_2F_2$.

Thus, the invention is a new mixture of gases for the reactive ion etching of silicon dioxide. It is used to etch insulator ($SiO_2$) vias to provide contact windows to the refractory superconductors niobium and niobium nitride in integrated circuits. The gas mixture of nitrogen trifluoride and argon etches silicon dioxide at a higher rate than the metals, thus providing etch selectivity. Furthermore, in contrast to standard etch gas mixtures, the $NF_3$ mixture does not form polymer deposits because the mix contains no hydrogen or carbon.

The invention is not to be construed as limited to the particular examples described herein as these are to be regarded as illustrative, rather than restrictive. The invention is intended to cover all structures and processes which do not depart from the spirit and scope of the invention.

We claim:

1. An improved method for providing silicon dioxide with openings which expose contact pad areas for connections to superconductor in the preparation of superconducting integrated circuits, said method being of the type utilizing depositing of a silicon dioxide film on a substrate which has superconductor on parts of its surface, placing a resist film on the silicon dioxide film, patterning the resist film to expose portions of the silicon dioxide, and reactive ion etching the exposed portions of the silicon dioxide film to expose contact pad areas of superconductor; said improved method comprising:

utilizing an etchant gas consisting essentially of 50-95 volume percent nitrogen trifluoride and 5-50 volume percent rare gas for said reactive ion etching of the exposed portions of the silicon dioxide film to expose contact pad areas of superconductor, whereby carbon-containing etchant is not used and polymer by-produces of the etching process are essentially completely avoided.

2. The improved method of claim 1, wherein said etchant gas is 67–87 volume percent nitrogen trifluoride.

3. The improved method of claim 1, wherein said etchant gas is 72–82 volume percent nitrogen trifluoride.

4. The improved method of claim 1, wherein said etchant gas is about 77 volume percent nitrogen trifluoride.

5. The improved method of claim 1, wherein a plasma power density of about 0.27 watt/square centimeter is utilized during said reactive ion etching.

6. The improved method of claim 1, wherein an etch chamber at a pressure of about 75 millitorr is utilized during said reactive ion etching.

7. The improved method of claim 1, wherein said superconductor is niobium or niobium nitride.

8. The improved method of claim 1, wherein said rare gas is argon or neon or mixtures thereof.

* * * * *